(12) United States Patent
Martin

(10) Patent No.: US 12,463,379 B2
(45) Date of Patent: Nov. 4, 2025

(54) STACKABLE HOUSING INCLUDING ELECTRICAL PIN SUPPORT

(71) Applicant: TE Connectivity Solutions GmbH, Schaffhausen (CH)

(72) Inventor: Galen M. Martin, Middletown, PA (US)

(73) Assignee: TE Connectivity Solutions GmbH (CH)

( * ) Notice: Subject to any disclaimer, the term of this patent is extended or adjusted under 35 U.S.C. 154(b) by 438 days.

(21) Appl. No.: 17/903,576

(22) Filed: Sep. 6, 2022

(65) Prior Publication Data
US 2023/0074900 A1    Mar. 9, 2023

Related U.S. Application Data

(60) Provisional application No. 63/241,491, filed on Sep. 7, 2021.

(51) Int. Cl.
*H01R 13/629*    (2006.01)
*H05K 5/00*    (2025.01)

(52) U.S. Cl.
CPC ......... *H01R 13/629* (2013.01); *H05K 5/0065* (2013.01)

(58) Field of Classification Search
None
See application file for complete search history.

(56) References Cited

U.S. PATENT DOCUMENTS

| | | | | |
|---|---|---|---|---|
| 3,963,300 A | * | 6/1976 | Patton | H01R 31/02 |
| | | | | 439/676 |
| 4,936,785 A | * | 6/1990 | Krug | G06F 13/409 |
| | | | | 439/59 |
| 9,742,081 B1 | * | 8/2017 | Annis | H01R 12/7082 |
| 11,799,230 B2 | * | 10/2023 | Jiang | H01R 13/6461 |
| 2006/0223379 A1 | * | 10/2006 | Ho | H01R 12/75 |
| | | | | 439/660 |
| 2017/0324202 A1 | * | 11/2017 | Little | H01R 24/62 |

* cited by examiner

*Primary Examiner* — Oscar C Jimenez

(57) ABSTRACT

An electrical device housing comprises a body defining a component space, a pin support structure, and an alignment element. The pin support structure is arranged within the component space and defines a plurality of openings sized to receive and support a plurality of conductive pins of a connector to be secured to the housing. The alignment element is formed on an exterior surface of at least one of a top or bottom side of the housing and is located to engage with a corresponding alignment element formed on the other one of the top or bottom side of another one of the housings.

16 Claims, 8 Drawing Sheets

STACKABLE HOUSING INCLUDING ELECTRICAL PIN SUPPORT

CROSS-REFERENCE TO RELATED APPLICATIONS

This application claims priority under 35 U.S.C. § 119 to U.S. Provisional Patent Application No. 63/241,491, filed on Sep. 7, 2021.

FIELD OF THE INVENTION

The present disclosure relates to electrical devices, and more particularly, to housings for electrical components.

BACKGROUND

Electronic components are often packaged as assemblies or modules within discrete housings. The housings may serve to both position devices contained therein, as well as to shield components of the assembly from harsh environmental conditions. External electrical connections are typically formed with these housings via a connector interface. The connector interface may include a receiving connector body including a plurality of conductive pins (e.g., compliant pins). The pins may extend front a front end of a connector body arranged outside of the housing, and into the housing for connection to relevant components arranged therein (e.g., a printed circuit board).

According to the prior art, the connector body is molded over the conductive pins within the housing, ensuring their proper positioning and adequate support. The overmolding process, however, adds complication and expense to the manufacturing process of the connector. This also eliminates so-called stitch and fold manufacturing techniques. Further, during manufacturing and shipping, grouping or stacking assemblies together saves space, and thus adds efficiency and reduces costs. However, current housing designs cannot be stacked in a stable manner, nor stacked with their connectors in place, as damage to the exposed compliant pin ends is risked by relative housing movement.

Improved electronic module housings and associated assemblies are desired.

SUMMARY

According to an embodiment of the present disclosure, an electrical device housing comprises a body defining a component space, a pin support structure and an alignment element. The pin support structure is arranged within the component space and defines a plurality of openings sized to receive and support a plurality of conductive pins of a connector to be secured to the housing. The alignment element is formed on an exterior surface of at least one of a top or bottom side of the housing and is located to engage with a corresponding alignment element formed on the other one of the top or bottom side of another one of the housings.

BRIEF DESCRIPTION OF THE DRAWINGS

The invention will now be described by way of example with reference to the accompanying Figures, of which.

DETAILED DESCRIPTION OF THE EMBODIMENTS

Figure 1:
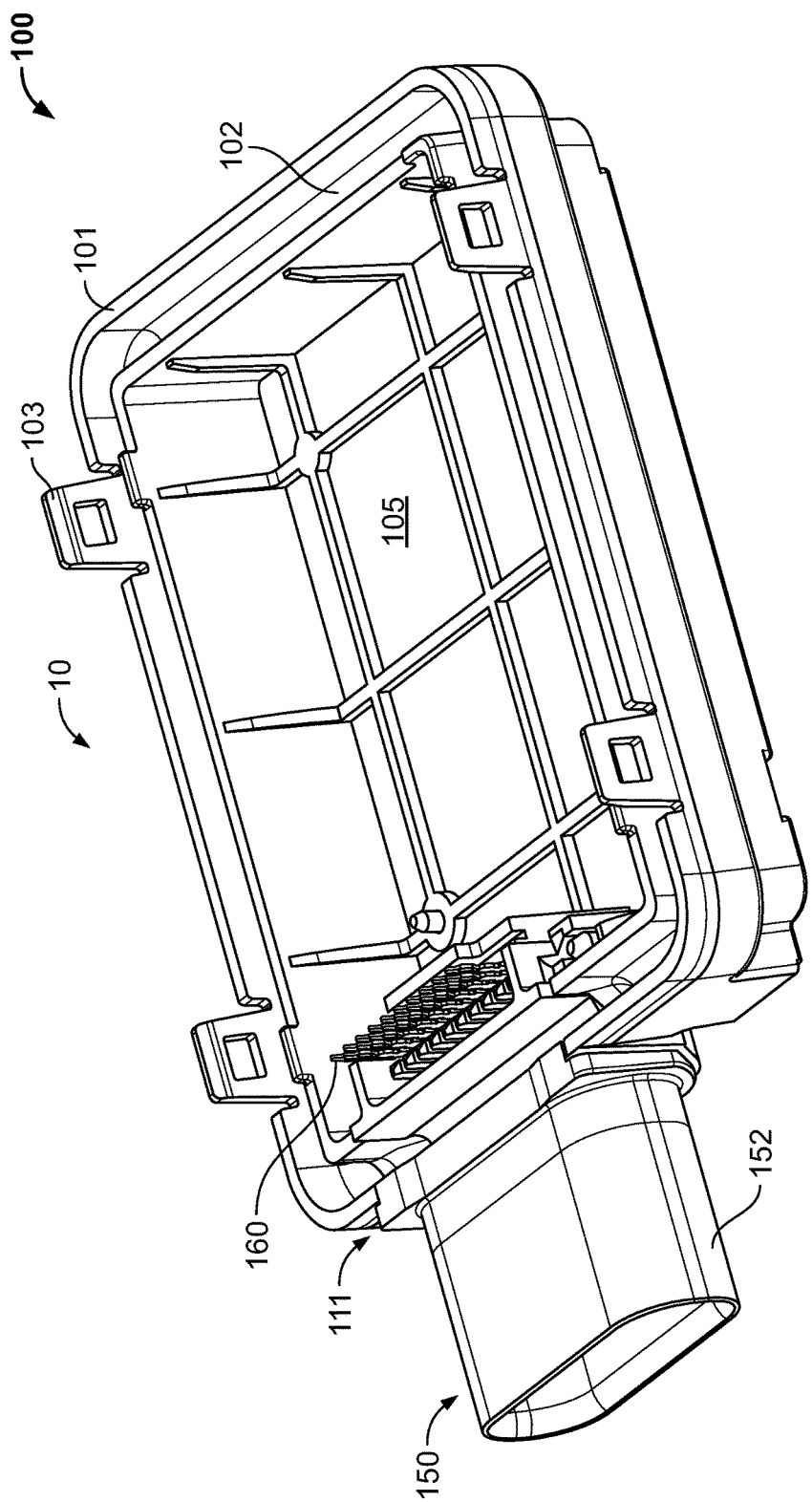
FIG. 1 is perspective view of an electrical device assembly according to an embodiment of the present disclosure in a partially assembled state.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present disclosure include an electronics module including a housing for an electrical device and an electrical connector. The housing includes a body defining a component space, a pin support structure and at least one alignment feature formed on an exterior surface of the body. More specifically, the pin support structure is arranged within the component space and defines a plurality of openings adapted to receive and support a plurality of conductive pins of the connector to be secured to the housing. The alignment feature is formed on at least one of a top or bottom side of the housing and is adapted to engage with a corresponding alignment feature formed on the other one of the top or bottom side of another one of the housings (e.g., another identical housing or assembly) during stacking.

Referring now to FIG. 1, a portion of an electronics module 10 according to an embodiment of the present disclosure is shown. The module 10 includes an electrical housing 100 (e.g., a polymer housing) adapted to receive a connector or connector assembly 150 therein. Specifically, the connector is arranged through a sidewall of the housing 100 via a correspondingly-sized opening 111 such that a mating end of the connector is arranged outside of the housing, and a terminating end is arranged within the housing. The housing 100 may define one portion, or one half, of a complete electronics module housing. More specifically, the housing 100 may be adapted to engage with a cover or second body portion (not shown). The cover may be selectively secured over an open side of the housing 100 via the illustrated catches 103 for sealing an internal cavity space 105 defined by the housing.

The connector 150 defines a mating end 152 adapted to receive a corresponding mating connector (not shown). The connector 150 houses a plurality of conductive terminals or pins 160, including ends extending into the internal cavity 105 of housing 100. In the exemplary embodiment, vertically extending free ends of each pin 160 define compliant pin ends, including two opposing elastic arms (see FIGS. 4 and 5). The compliant pin ends of each terminal 160 are adapted to engage with, for example, a corresponding conductive opening formed in a printed circuit board (PCB) for establishing an electrical connection therewith.

Still referring to FIG. 1, with the connector 150 assembled with the housing 100, a continuous and uniform channel 102 (e.g., having a uniform cross-section over its length) is formed that surrounds an outer periphery of the housing. The channel 102 may accommodate the mating housing portion or cover and/or a sealing element arranged therein. An outer wall of the channel 102 may be defined by an exterior perimeter wall 101, which may also integrally define the catches 103.

Figure 2:
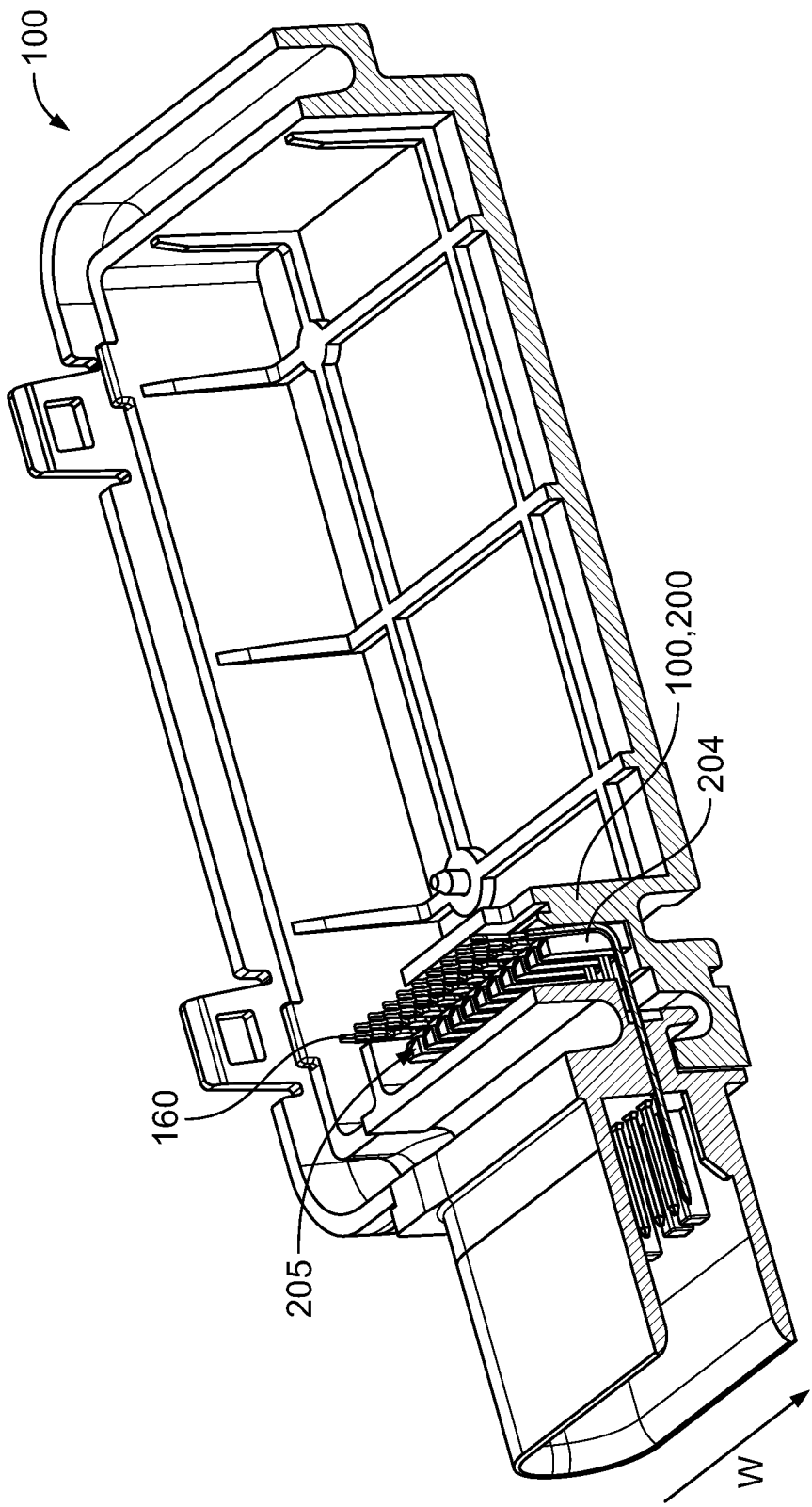
FIG. 2 a cross-sectional perspective view of the electrical device assembly of FIG. 1.
Figure 3:
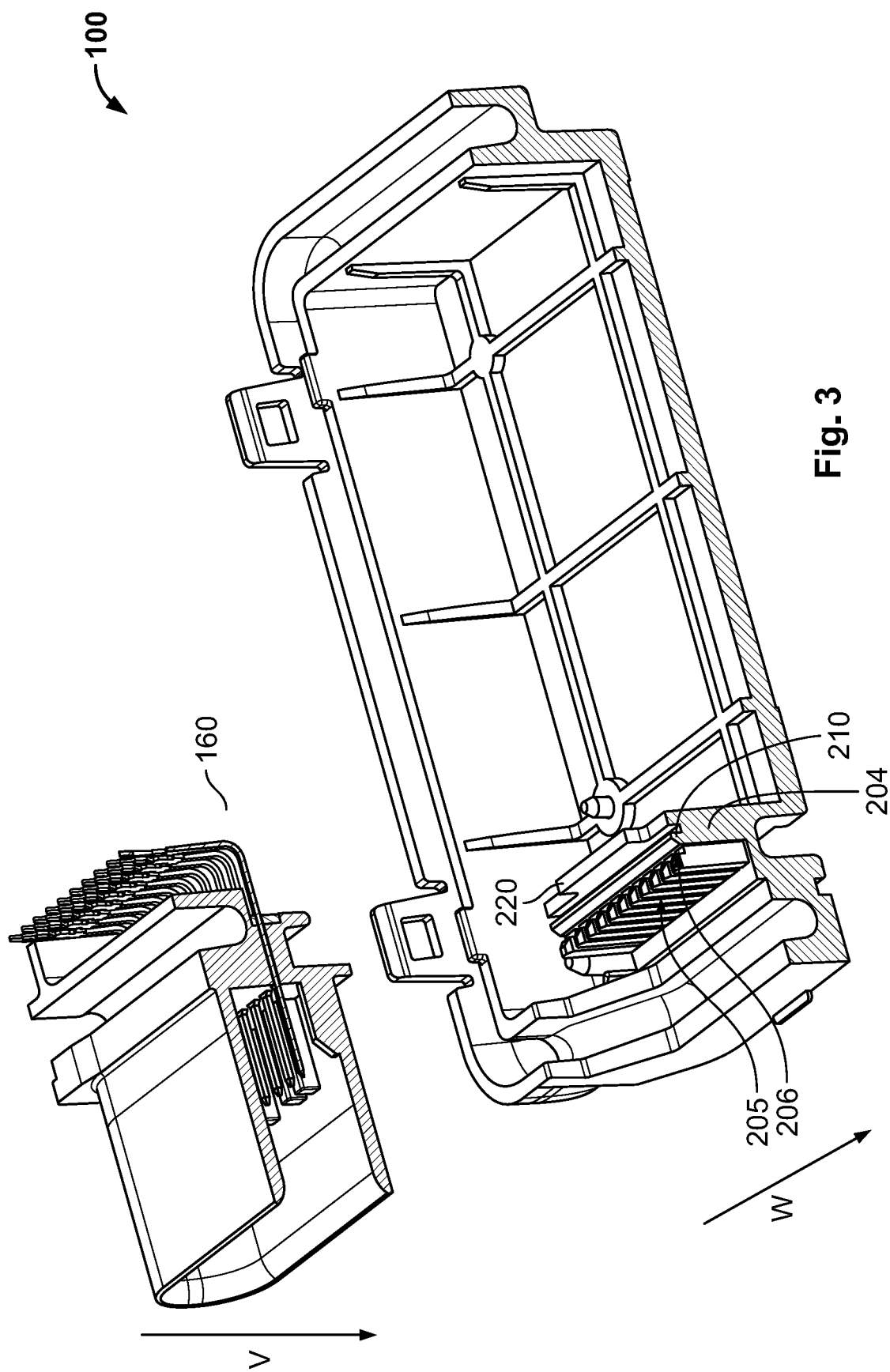
FIG. 3 is a perspective view of the electrical device assembly of FIG. 2 in an unassembled state.
Figure 4:
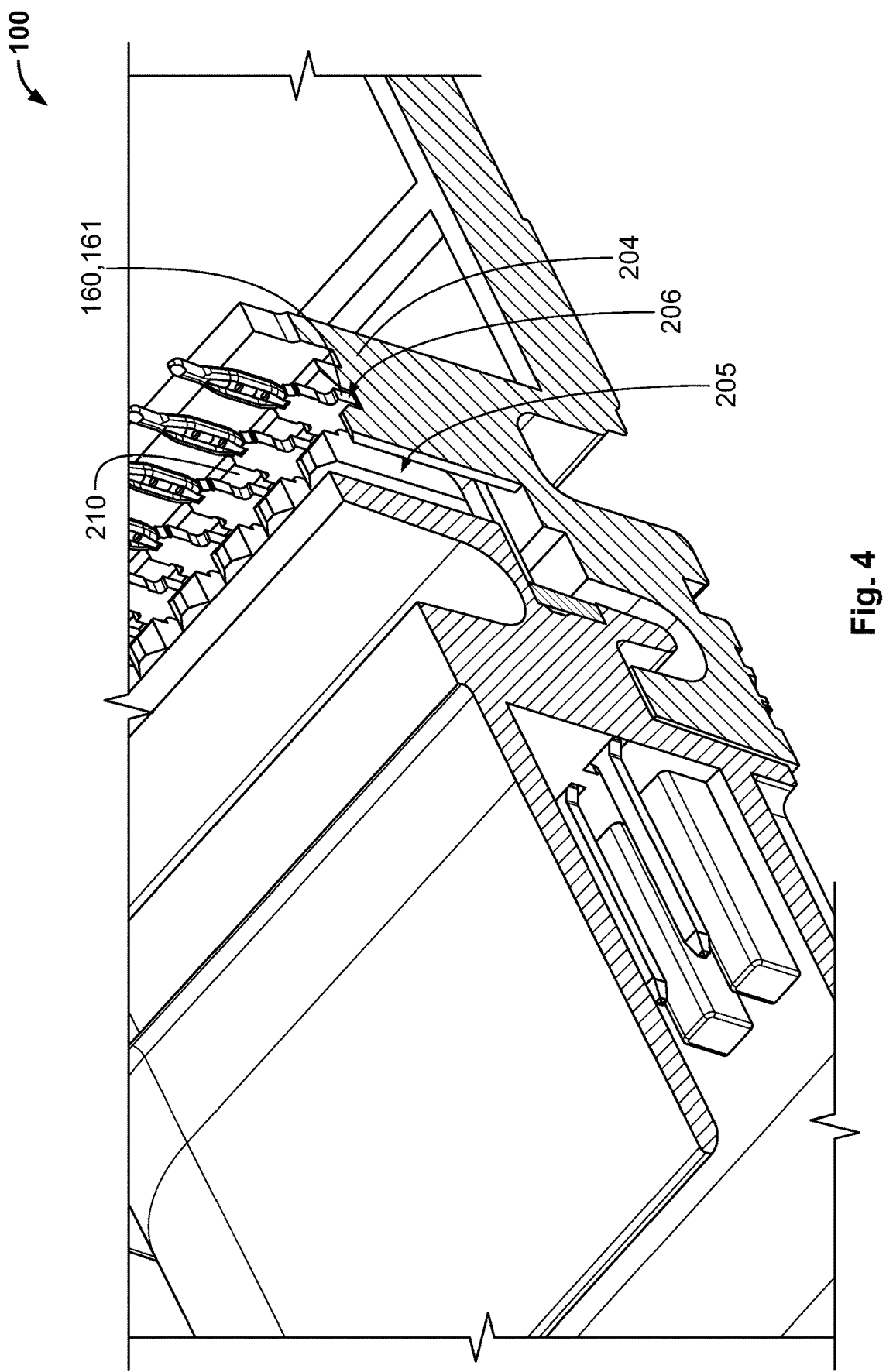
FIG. 4 is another cross-sectional view of the electrical device assembly of FIG. 1.

Referring to FIGS. 2-4, the housing 100 defines a support structure 200 for supporting the pins 160 in their desired position (e.g., generally vertical positions). The support structure 200 includes a plurality of partitioning walls 204 arranged in a row extending in a width direction W of the housing 100. The partitioning walls 204 create a plurality of slot-like openings 205, or simply slots, therebetween which are sized to receive the pins 160. Each of the openings 205 is open on a forward-facing side thereof (i.e., toward the connector), for receiving each pin during the installation of the connector 150 (e.g., from a vertical insertion direction V). The support structure 200 is preferably molded or otherwise formed integrally with the housing 100.

Figure 5:
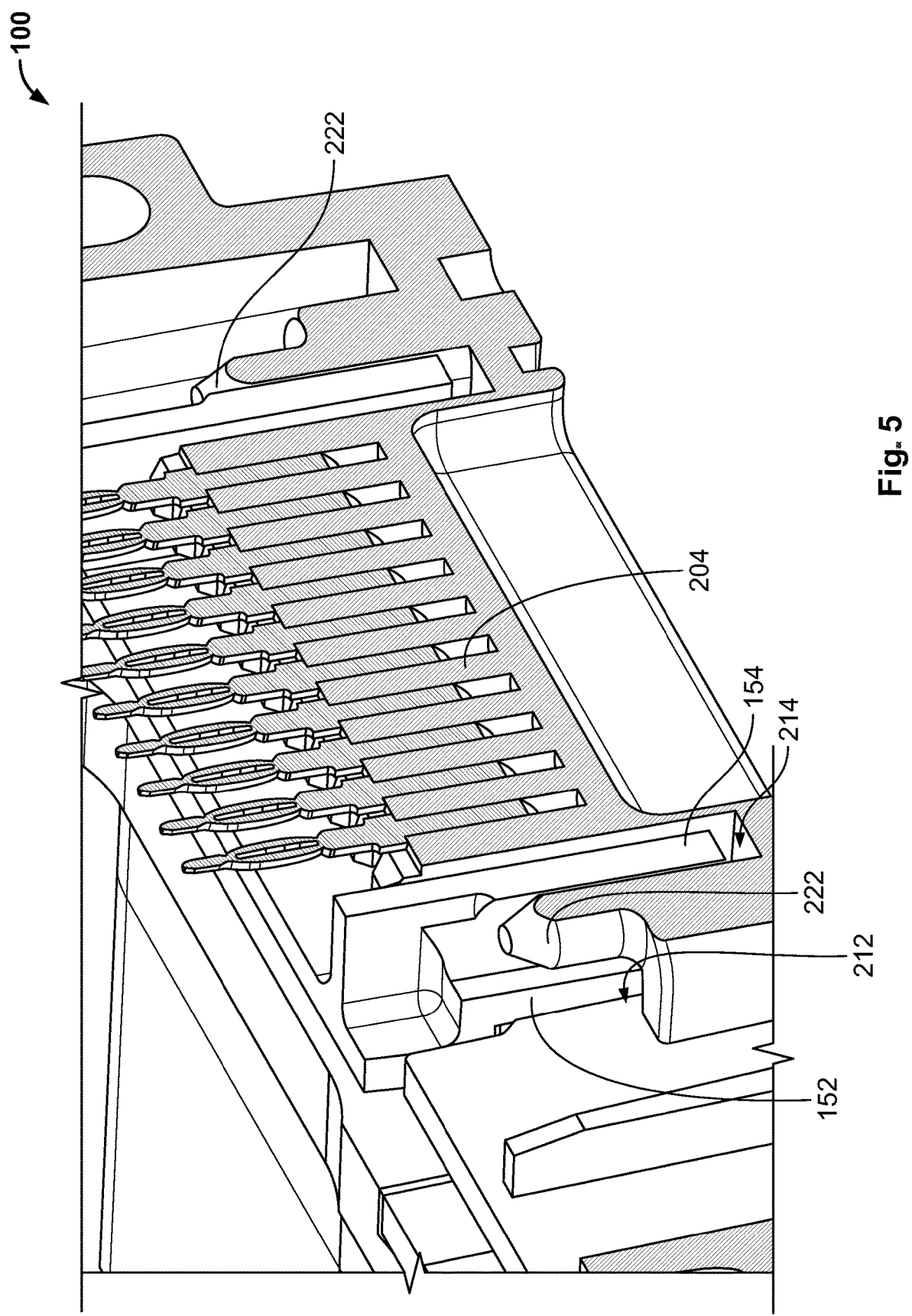
FIG. 5 is yet another cross-sectional view of the electrical device assembly of FIG. 1.

As shown most clearly in FIGS. 4 and 5, each pin 160 defines an expanded head portion 161. Lateral sides of each head portion 161 rest on respective adjacent partitioning walls 204. More specifically, the partitioning walls 204 define a lateral slot 206 extending through each wall in the width direction W. The expanded head portions 161 are arranged within the slot 206, and extend or expand in the width direction(s). In this way, each pin 160 is positively located and supported in or along three axes or directions; laterally via the partitioning walls 204 and/or openings 205, and longitudinally and vertically via the slot 206. Edges of the slot 206 may be tapered or chamfered, aiding in correct pin placement.

The partitioning walls 204 may be joined at a rear end by a common, continuous backwall 210 extending in the lateral or width direction W. The backwall 210 may define a raised protrusion or platform 220 for supporting another housing 100 stacked thereon (as shown in FIG. 7), and/or a PCB to be installed within the housing 100 after further assembly.

The support structure 200 further defines intersecting laterally and longitudinally extending slots or openings 212,214 for receiving corresponding protruding ends or end walls 152,154 of the connector 150. In order to aid the placement of the connector 150 within the support structure 200 of the housing 100, a guiding feature or guide pin 222 having a tapered free end may be formed by the support structure 200. The protruding ends 152,154 of the connector 150 may be guided by this pin 222 into a proper position for the pins 160 of the connector 150 to properly aligned with and be received by the support structure 200.

Figure 6:
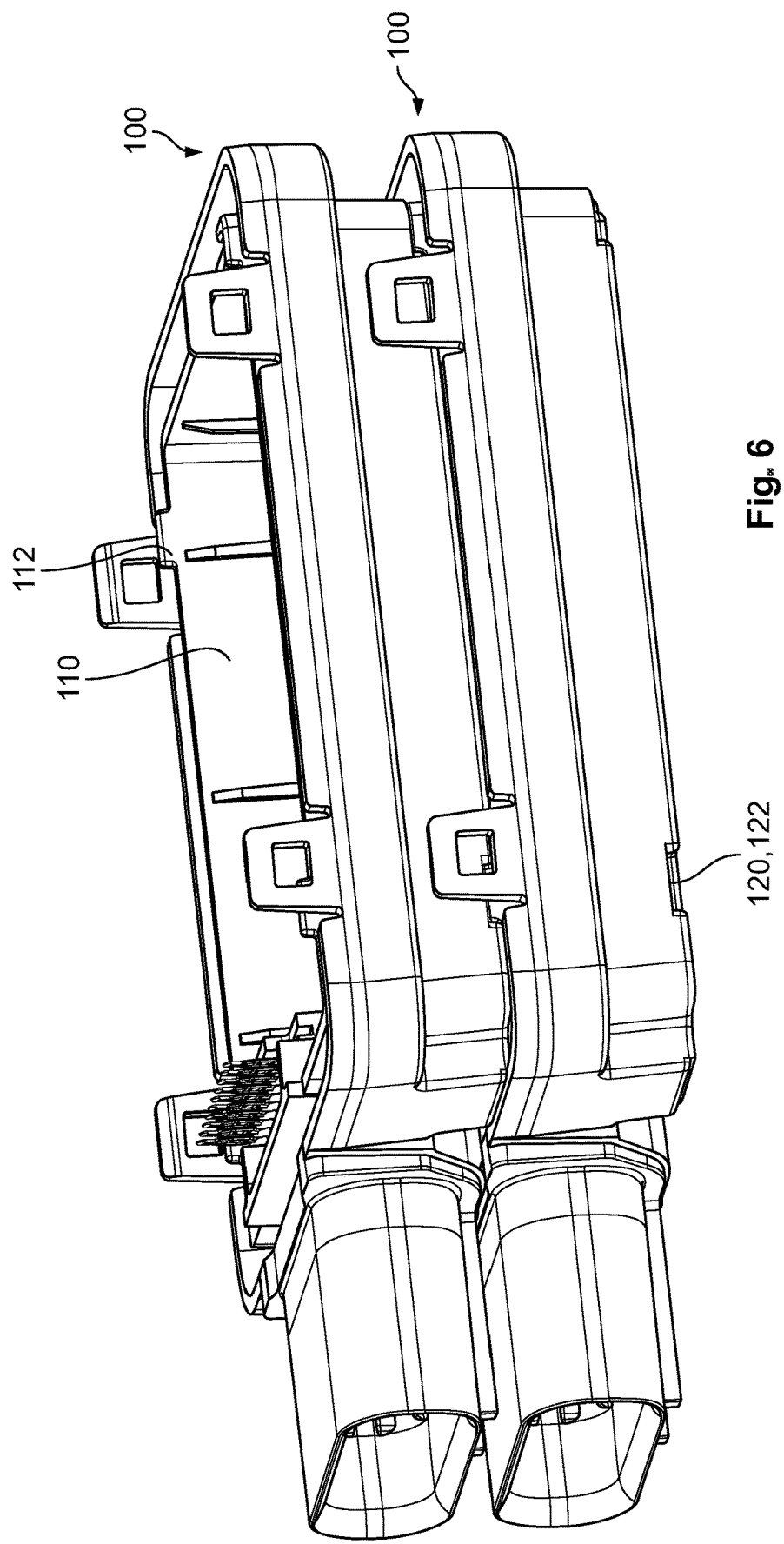
FIG. 6 is a perspective view of a stack of electrical device assemblies according to an embodiment of the present disclosure.
Figure 7:
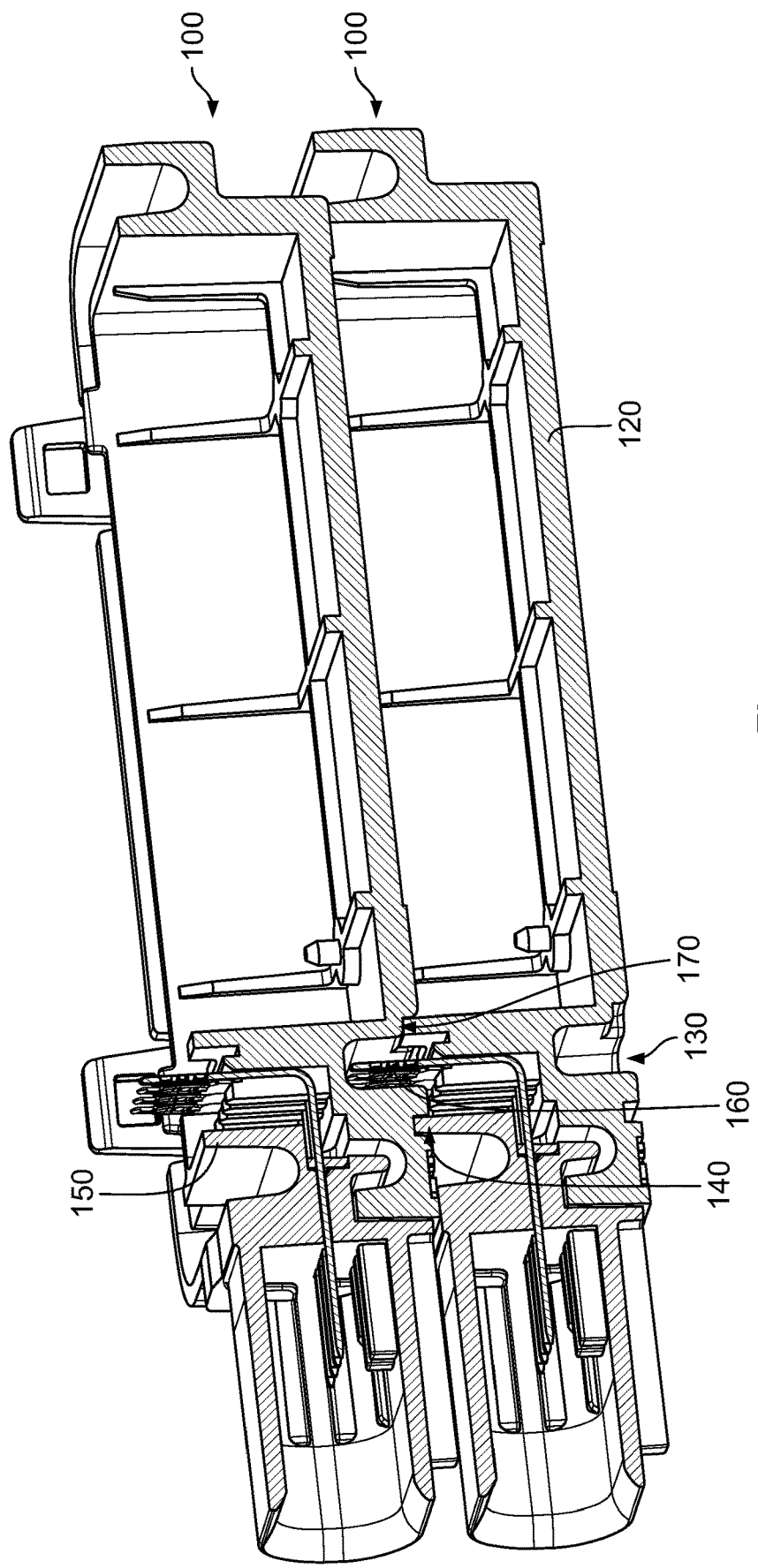
FIG. 7 is a cross-sectional view of the stack of electrical device assemblies of FIG. 6.
Figure 8:
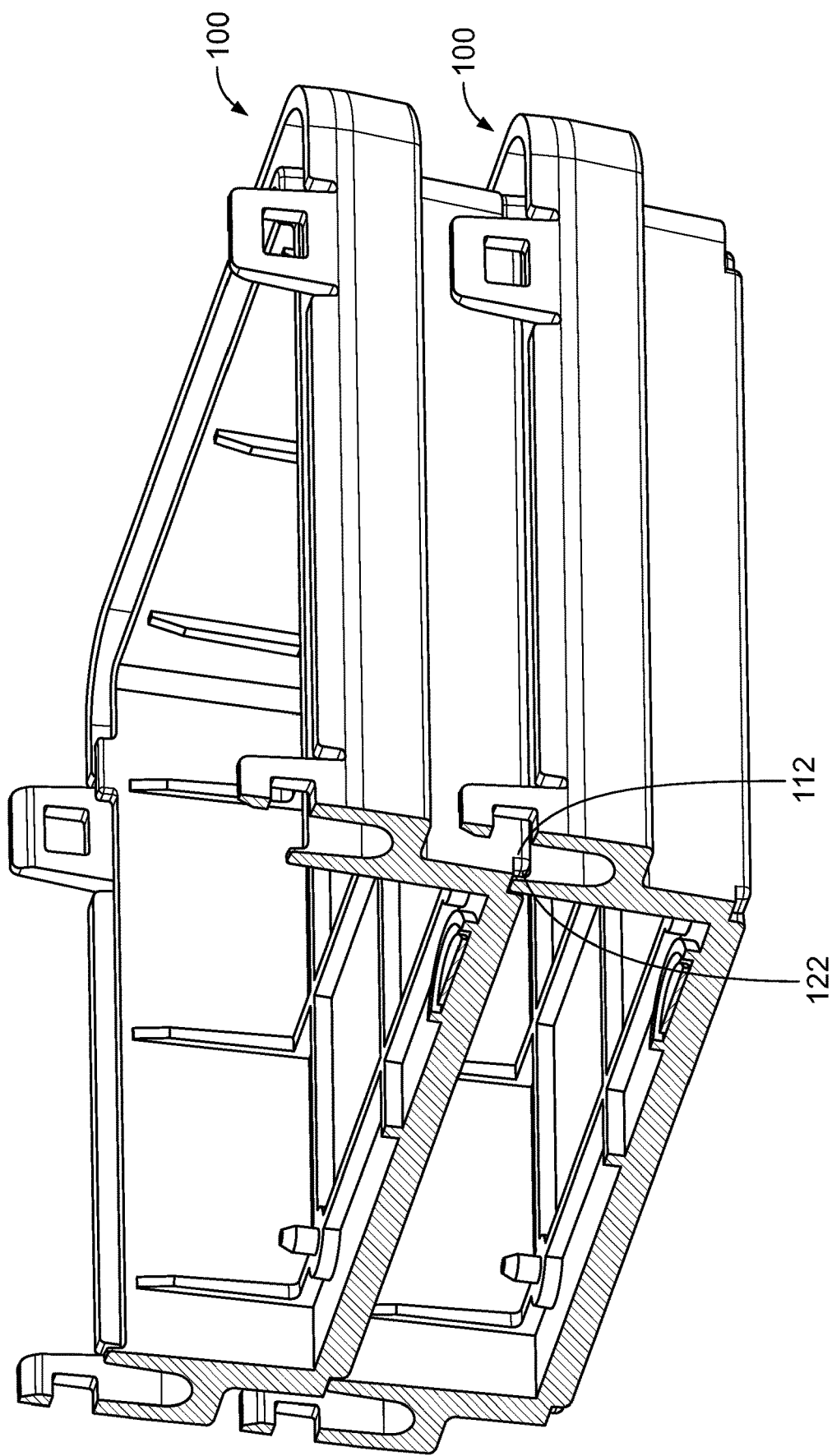
FIG. 8 is a cross-sectional view of a stack of housings of the electrical device assemblies of FIG. 6.

Referring now to FIGS. 6-8, the interaction between a pair of stacked housings 100 will be described. An inner edge 110 of the housing 100 may define recess, or in the illustrated embodiment, protrusions 112 extending vertically therefrom. Likewise, an underside 120 of the housing 100 comprises corresponding features, in the exemplary embodiment, recesses 122 sized and located to correspond to the protrusions in a complimentary manner. In this way, with a plurality of housings 100 stacked onto one another, the complementary features 112,122 engage one another, or are keyed together. This provides a stable stack, restricting relative movement between adjacent houses and protecting the connector and pin assembles from damage. In the exemplary embodiment, the complementary features 112, 122 may be located or arranged directly inward, or at corresponding locations to, the latches 103.

As shown with particularity in FIG. 7, the underside 120 of each of the housings 100 includes a first recess 130 sized and located to accommodate the pins 160 of an installed connector of a housing arranged therebeneath. A second recess 140 is formed for accommodating an inner wall of the connector 150 forming a portion of the continuous channel 102. Yet a third recess 170 is formed for receiving the raised protrusion 220 of the supporting structure 200 in the stacked configuration.

The engagement between all of the above-described features adds stability to a housing stack. This results in robust shipping of both stacked empty housings, as well as stacked subassemblies (i.e., at least housings 100 and installed connectors 150). The corresponding engaging and accommodating features also results in the lowest possible overall shipping highest of at least two stacked assemblies. Accordingly, embodiments of the present disclosure not only reduce potential component damage during shipping, but also reduce overall shipping costs.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An electrical device housing, comprising:
    a body defining a component space;
    a pin support structure arranged within the component space and defining a plurality of openings sized to receive and support a plurality of conductive pins of a connector to be secured to the housing, the plurality of openings are defined by a continuous rear wall connecting a plurality of longitudinally extending partitioning walls;
    a protrusion extending from the continuous rear wall at a top side of the body; and a recess formed in a bottom side of the body beneath the pin support structure and opposite the protrusion, the recess corresponds to the protrusion and is shaped to receive the protrusion of another electrical device housing.

2. The housing of claim 1, wherein the pin support structure is adapted to prevent motion of the plurality of conductive pins in three distinct axes.

3. The housing of claim 1, wherein the housing is adapted to receive a connector at a first end thereof, and the plurality of openings open in a direction of the first end and in a vertical direction.

4. The housing of claim 3, wherein the plurality of openings define slots arranged in a row and are at least partially defined by the plurality of longitudinally extending partitioning walls, each slot open in a first direction toward a connector opening of the housing and in a second direction.

5. The housing of claim 4, wherein a slot is formed through the partitioning walls in a lateral direction, the slot being open in the vertical direction for receiving a portion of each of the conductive pins.

6. The housing of claim 5, wherein leading edges of the slot are tapered in the vertical direction.

7. The housing of claim 5, further comprising an electrical connector mounted to the housing and including the plurality of conductive pins, the conductive pins having unsupported ends extending from a rear of the connector and into a respective one of the plurality of openings.

8. The housing of claim 7, wherein each of the conductive pins extends in a generally horizontal direction from the connector into one of the plurality of openings, and includes a free end portion extending generally vertically upward from within the opening.

9. The housing of claim 8, wherein each conductive pin defines an expanded portion extending in the lateral direction and arranged within the lateral slot defined through the partitioning walls.

10. The housing of claim 8, wherein the end portion of each conductive pin extends vertically from within the opening to a height greater than a height of the support structure.

11. The housing of claim 8, wherein each conductive pin comprises a compliant pin.

12. The housing of claim 1, further comprising an alignment element formed on an exterior surface of at least one of the top or bottom side of the housing and located to engage with a corresponding alignment element formed on the other one of the top or bottom side of the another electrical device housing, the alignment element including a plurality of second protrusions formed on the top side of the housing, and a plurality of second recesses formed in the bottom side of the housing, the plurality of second recesses corresponding in location to the plurality of second protrusions such that the plurality of second recesses of the housing receive the plurality of second protrusions of the another electrical device housing.

13. An electrical device assembly, comprising:
a first electrical device, including:
a first housing defining a first component space;
a first connector mounted to the first housing and having a first plurality of conductive pins, the first conductive pins including ends extending from the first connector and into the first component space;
a first plurality of pin supports formed within the first component space, each pin supports receiving and positioning one of the first plurality of conductive pins within the first component space; and
a first alignment element formed on a top side of the first housing; and
a second electrical device positioned on top of the first electrical device, including:
a second housing defining a second component space;
a second connector mounted to the second housing and having a second plurality of conductive pins, the second conductive pins including ends extending from the second connector and into the second component space;
a second plurality of pin supports formed within the second component space, each pin support receiving and positioning one of the second plurality of conductive pins within the second component space; and
a second alignment element formed on a bottom side of the second housing and engaging with the first alignment element of the first electrical device, the engaged alignment elements preventing relative motion between the first electrical device and the second electrical device in a plurality of directions.

14. The assembly of claim 13, wherein the housing of the second electrical device defines a recess formed in the bottom side thereof and located beneath the plurality of pin supports, end portions of the plurality of conductive pins of the first electrical device received within the recess.

15. The assembly of claim 13, wherein:
the housing of the first electrical device defines a standoff arranged adjacent the plurality of pin supports; and
the housing of the second electrical device defines a recess in the bottom side thereof receiving the standoff.

16. The assembly of claim 13, wherein the pin supports of the first and second housings include:
a plurality of longitudinally extending partitioning walls defining a plurality of pin openings; and
a slot defined through the plurality of partitioning walls in a lateral direction and opening in a vertical direction, each of the plurality of conductive pins defining an expanded portion extending in the lateral direction and engaged within the slot for locating each pin in three distinct axes.

* * * * *